United States Patent [19]
Wang et al.

[11] Patent Number: 5,867,453
[45] Date of Patent: Feb. 2, 1999

[54] SELF-SETUP NON-OVERLAP CLOCK GENERATOR

[75] Inventors: Shyh-Jye Wang; Chi-Chiang Wu, both of Hsinchu; Hsing-Chien Huang, Taipei Hsien, all of Taiwan

[73] Assignee: Taiwan Semiconductor Manufacturing Co., Ltd., Hsinchu, Taiwan

[21] Appl. No.: 19,686

[22] Filed: Feb. 6, 1998

[51] Int. Cl.$^6$ .............................. G04F 8/00; H03K 3/037; H03K 5/13

[52] U.S. Cl. ...................... 368/120; 327/239; 327/269; 327/295

[58] Field of Search .................................... 368/113, 120; 327/239, 256, 261, 269, 291, 295, 296

[56] References Cited

U.S. PATENT DOCUMENTS

| | | | |
|---|---|---|---|
| 4,877,974 | 10/1989 | Kawai et al. | 307/269 |
| 5,389,831 | 2/1995 | Eisenstadt | 327/239 |
| 5,440,250 | 8/1995 | Albert | 327/239 |
| 5,444,405 | 8/1995 | Truong et al. | 327/239 |
| 5,710,744 | 1/1998 | Suda | 368/120 |
| 5,751,665 | 5/1998 | Tanoi | 368/120 |

*Primary Examiner*—Vit Miska
*Attorney, Agent, or Firm*—Christensen O'Connor Johnson & Kindness PLLC

[57] ABSTRACT

A self-setup non-overlap clock generator is disclosed. This clock generator includes a primary clock signal input terminal for providing a primary clock signal, and a selection signal input terminal for providing at least one selection signal. The present invention also includes a first logic gate having a first input terminal coupled to receive an inverted signal of the primary clock signal. Further, a second logic gate is provided, having a first input terminal coupled to receive the primary clock signal. A first programmable delay portion is used to delay an output signal from the first logic gate an amount of time according to the selection signal, and a second programmable delay portion is used to delay an output signal from the second logic gate a predetermined amount of time according to the selection signal. Therefore, a first clock signal is generated from the output of the first logic gate, and a second clock signal is generated from the output of the second logic gate. Particularly, the present invention includes a test circuit to determine whether a non-overlap space between the first clock signal and the second clock signal conforms to a predetermined value. Finally, a selector is used to generate the at least one selection signal in response to at least one output of the test circuit such that a smallest value out of all possible non-overlap spaces is chosen.

23 Claims, 13 Drawing Sheets

SELF-SETUP NON-OVERLAP CLOCK GENERATOR

CROSS REFERENCE TO RELATED APPLICATIONS

This invention is related to U.S. patent application Ser. No. 08/968,558 entitled "Programmable Non-Overlap Clock Generator" assigned to same assignee as the present application and incorporated herein by reference in their entirety.

BACKGROUND OF THE INVENTION

1. Field of the Invention

The present invention relates to a clock generator, and more particularly, to a self-setup non-overlap clock generator that generates non-overlap clock signals with self-setup non-overlap space.

2. Description of the Prior Art

A shift register circuit is conventionally used to shift data through serially connected registers or latches. FIG. 1A shows a schematic diagram illustrating a typical shift register circuit 10 consisting of two serially connected registers DL1 and DL2, and FIG. 1B shows timing diagrams of the critical signals of FIG. 1A. A data input signal data2 is shifted from an input terminal Din of the first latch DL1 to an intermediate terminal Dint of the second latch DL2 at time t1 when a first clock signal phi1 is active (e.g., having a logic high level). The shifted data signal data2 is subsequently shifted from the intermediate terminal Dint to an output terminal Dout of the second latch DL2 at time t2 when a second clock signal phi2 is active (e.g., having a logic high level).

However, there are some parasitic capacitors and parasitic resistors caused by the material of the wiring in the shift register circuit 10, especially in shift register circuits implemented in an integrated circuit chip. FIG. 2A shows a schematic diagram illustrating a shift register circuit 20 with a parasitic capacitor C1 and a parasitic resistor R1 modeling the wire loading on the clock signal phi2. In this figure, the pertinent signals and components that are not changed in appearance from the arrangement of FIG. 1A are labeled with the same reference numerals. FIG. 2B shows timing diagrams of critical signals of FIG. 2A.

Referring to FIG. 2A, the clock signal phi2 is thus delayed due to the wire loading thereon, thereby generating a delayed clock signal phi2D inputting to the clock input terminal of the second latch DL2.

Referring now to FIG. 2B, the data input signal data2 is shifted from the input terminal Din of the first latch DL1 to the intermediate terminal Dint of the second latch DL2 at time t1 when the first clock signal phi1 is active (e.g., having a logic high level). At the same time, the delay clock signal phi2D remains active at its logic high level, therefore also shifting the data signal data2 to the output terminal Dout of the second latch DL2. Consequently, a preceding data signal data1, which is presumed to be at the output terminal Dout of the second latch DL2, is no longer there, and an unwanted data (i.e., the data signal data2 in this case) is thus retrieved. This situation is typically referred to as a race condition.

In order to overcome the aforementioned race condition, a non-overlap clock generator is disclosed to provide non-overlap clock signals. FIG. 3A schematically shows a diagram illustrating the non-overlap clock generator 30, whose output signals, i.e., the first clock signal phi1 and the second clock signal phi2, are shown in FIG. 3B. Owing to the guard band 31 between the non-overlap clock signals phi1 and phi2, it is thus guaranteed that the delayed clock signal phi2D does not overlap the first clock signal phi1, thereby preventing the race condition. Specifically, the data signal data2 is shifted from the input terminal Din of the first latch DL1 to the intermediate terminal Dint of the second latch DL2 at time t1. The output terminal Dout of the second latch DL2 has the data signal data1 until the delayed clock signal phi2D becomes active at time t2.

This non-overlap clock generator 30 primarily includes two standard NAND gates 301 and 302, and two delay components 303 and 304, cross-coupled as shown in FIG. 3A. FIG. 3C shows timing diagrams of some pertinent signals of FIG. 3A. The non-overlap space d in the non-overlap clock generator 30 is determined by both the delay time d1 of the delay component 304, and the delay time d2 of the NAND gate 302. Similarly, another non-overlap space 32 is determined by both the delay time of the delay component 303, and the delay time of the NAND gate 301. Since the delay time d2 is typically fixed by the intrinsic delayed and the loading of the NAND gate 301 or 302, therefore a suitable non-overlap space d is generally attained by adjusting the delay time d1 of the delay component 303 or 304. The selection of the delay time d1 is crucial for the following reasons. If it is too small, the race condition will occur and cause circuit malfunction. On the other hand, if a large non-overlap is chosen to guarantee that no race condition occurs, the performance of the chip will be unfortunately degraded due to the fact that the active states of the signals phi1 and phi2 are decreased. If the non-overlap space is increased without scarifying the active region of the clock signals phi1 and phi2, then the total period of the clock signals phi1 and phi2 should be increased, thereby slowing down the clock signals phi1, phi2, and degrading their performance. Moreover, because the delay time d1 determined by the two delay components 303 and 304 of the non-overlap clock generator 30 in FIG. 3A has a fixed value, therefore the non-overlap space can not be changed after the chip is fabricated. Another non-overlap clock generator 30 with different non-overlap space should be redesigned and fabricated when a different application is required, thereby wasting time and money.

In the above-identified application, a programmable non-overlap clock generator 40 is disclosed as shown in FIG. 4A. This clock generator 40 includes two standard NAND gates, i.e., the first NAND gate 420 and the second NAND gate 422. A primary clock signal clk is input to a first input terminal of the second NAND gate 422, and an inverted primary clock signal generated by an inverter 44 at node A is input to a first input terminal of the first NAND gate 420. The output terminal of the first NAND gate 420 is cross-coupled to a second input terminal of the second NAND gate 422 via a delay path determined by a first programmable delay circuit 460. Similarly, the output terminal of the second NAND gate 422 is cross-coupled to a second input terminal of the first NAND gate 420 via a delay path determined by a second programmable delay circuit 462. The first programmable delay circuit 460 and the second programmable delay circuit 462 are used to delay the output signal of the first NAND gate 420 and the output signal of the second NAND gate 422, respectively, a predetermined amount of time according to at least a selection signal sel. The predetermined amount of time is thus programmable (or adjustable) according to a different value of the selection signal (or signals). It is appreciated that the first programmable delay circuit 460 and the second programmable delay circuit 462 can alternatively be controlled individually by two sets of selection signals with different value. Timing diagrams representing some pertinent signals of FIG. 4A are shown in FIG. 4B. The non-overlap space d in the programmable non-overlap clock generator 40 is determined by both the delay time d1 of the first programmable delay circuit 460, and the delay time d2 of the NAND gate 422. Similarly, another non-overlap space 48 is determined by the delay time of the selected delay component in the second programmable delay circuit 462 and the delay time of the NAND gate 420. In FIG. 4A, buffers 490 and 491 are optionally and preferably connected to the output of the NAND gates 420 and 422 respectively to increase their driving capability.

As the delay time of the NAND gate is generally fixed by the intrinsic delay and the loading thereof, therefore suitable non-overlap space d is determined by the first programmable delay circuit 460. The non-overlap space can be selected or programmed even after the chip is fabricated, and therefore an optimized clock speed can be achieved, thereby enhancing the performance of the shift register circuits. However, some post-fabrication tests are required to determine an optimal non-overlap spacer, which is not only selected large enough to guarantee no race condition, but also selected as small as possible to optimize the performance of the circuits. Therefore, a need has been arisen to provide a self-setup non-overlap clock generator such that the non-overlap space between the generated clocks can be automatically determined, substantially optimizing the performance of shift register circuits.

SUMMARY OF THE INVENTION

In accordance with the present invention, a self-setup non-overlap clock generator is provided so that the non-overlap space between the generated clocks can be automatically determined, substantially optimizing clock speed and increasing the performance of shift register circuits. In one embodiment, the present invention includes a primary clock signal input terminal for providing a primary clock signal, and a selection signal input terminal for providing at least one selection signal. A first logic gate having a first input terminal and a second input terminal is used, wherein the first input terminal of the first logic gate is coupled to receive an inverted signal of the primary clock signal. Also, a second logic gate having a first input terminal and a second input terminal is used, wherein the first input terminal of the second logic gate is coupled to receive the primary clock signal. The present invention further includes first delay components coupled to receive an output of the first logic gate, and a first multiplexer coupled to the first delay components, one of the first delay components being then selected by the first multiplexer as an output of the first multiplexer coupled to the second input terminal of the second logic gate. Some second delay components are coupled to receive an output of the second logic gate, and a second multiplexer is coupled to the second delay components, one of the second delay components being then selected by the second multiplexer as an output of the second multiplexer coupled to the second input terminal of the first logic gate, thereby generating a first clock signal from the output of the first logic gate, and generating a second clock signal from the output of the second logic gate, wherein the first clock signal and the second clock signal are not logically active at the same time. Particularly, a self-test circuit is configured to test whether a non-overlap space between the first clock signal and the second clock signal conforms to a predetermined value, and a selector counter is used to provide the selection signal. Finally, a failure detect circuit is sued to command the self-test circuit to start the test, and control the selector counter in response to the output of the self-test circuit, so that a smallest value out of all possible non-overlap spaces is chosen.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
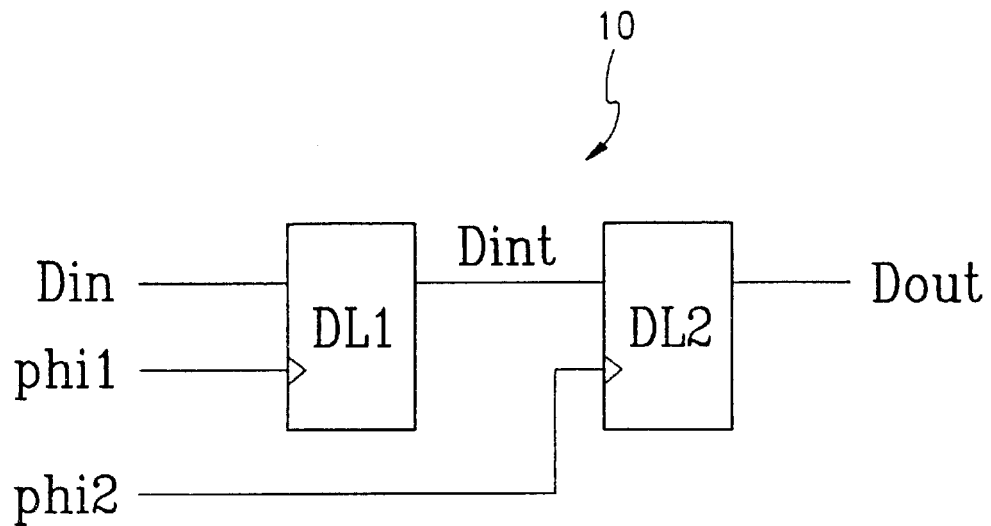
FIG. 1A shows a schematic diagram illustrating a typical shift register circuit.
Figure 1B:
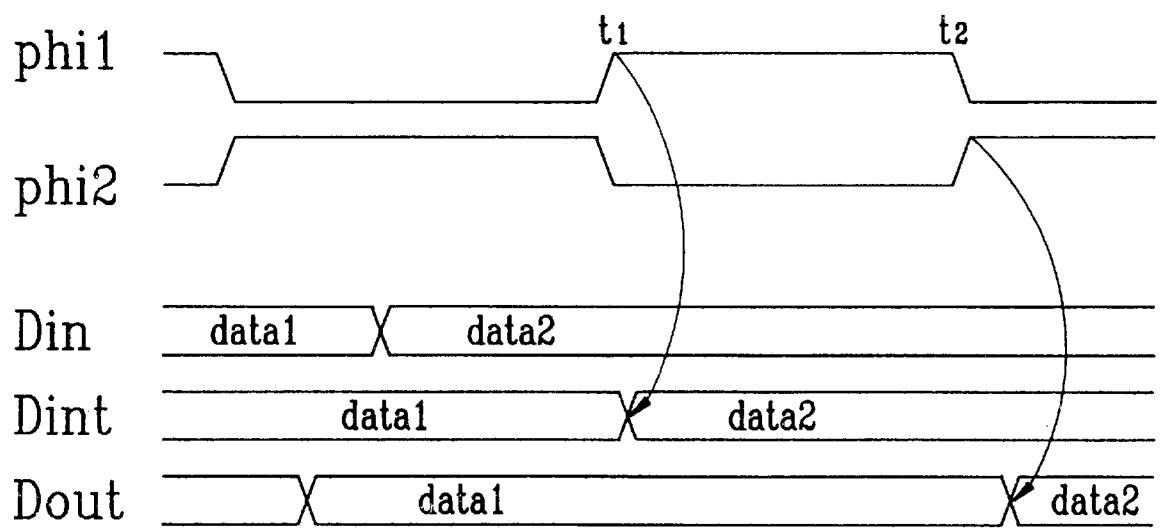
FIG. 1B shows timing diagrams of the critical signals of FIG. 1A.
Figure 2A:
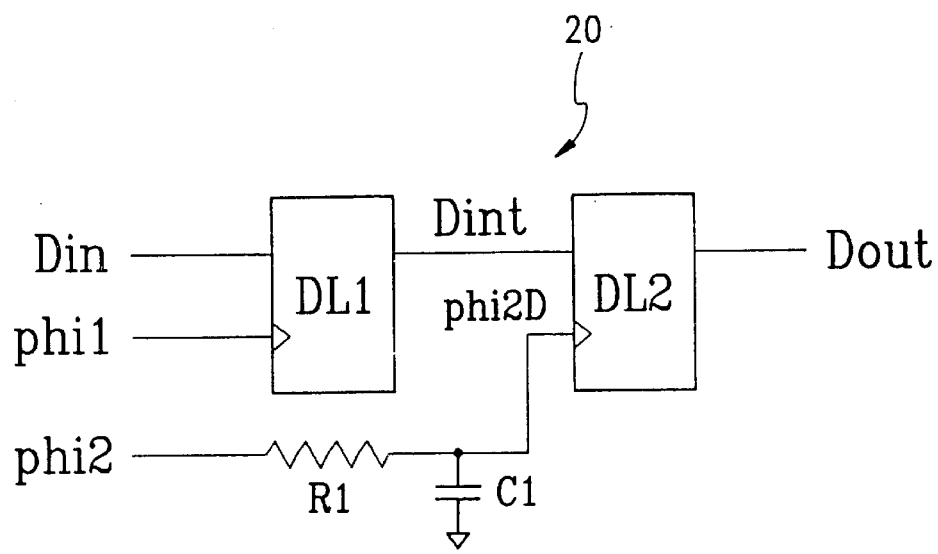
FIG. 2A shows a schematic diagram illustrating a shift register circuit with a parasitic capacitor and a parasitic resistor.
Figure 2B:
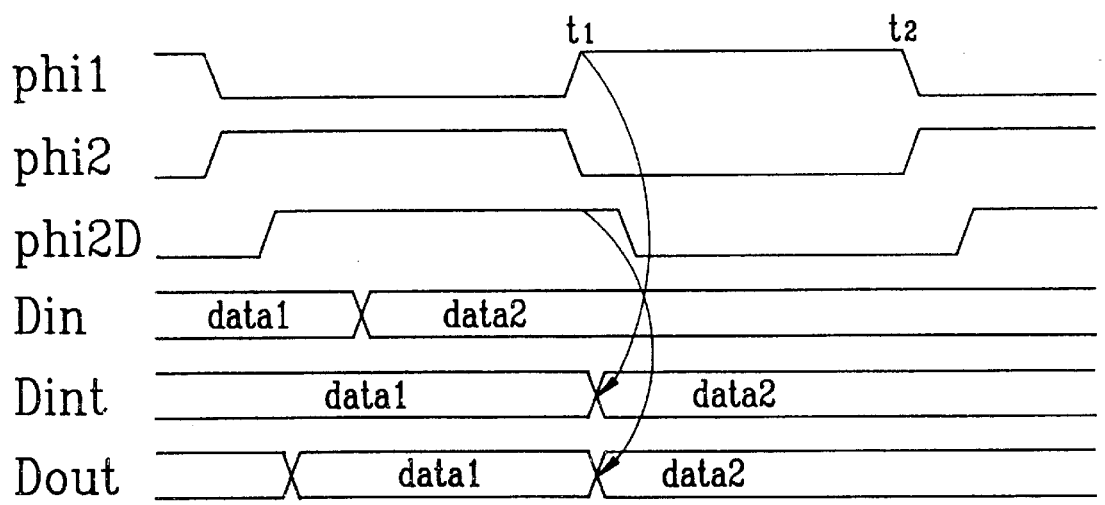
FIG. 2B shows timing diagrams of critical signals of FIG. 2A.
Figure 3A:
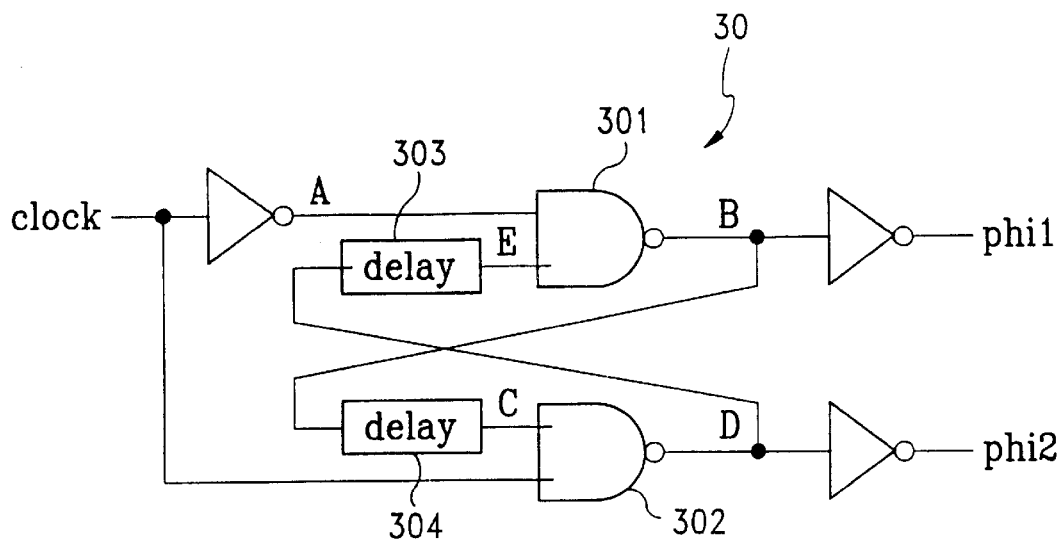
FIG. 3A shows a schematic diagram illustrating a non-overlap clock generator.
Figure 3B:
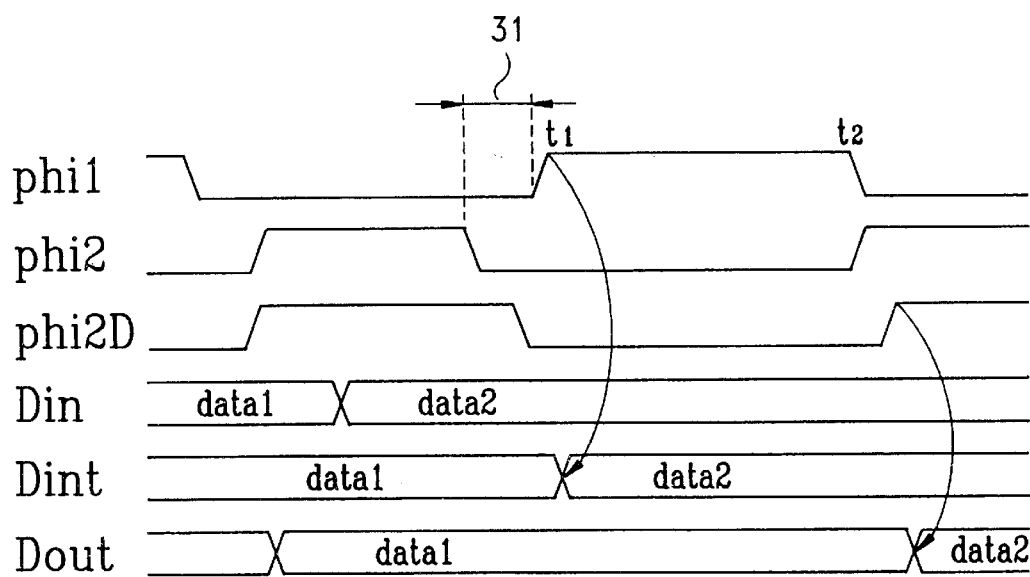
FIG. 3B shows timing diagrams of the output clock signals of FIG. 3A.
Figure 3C:
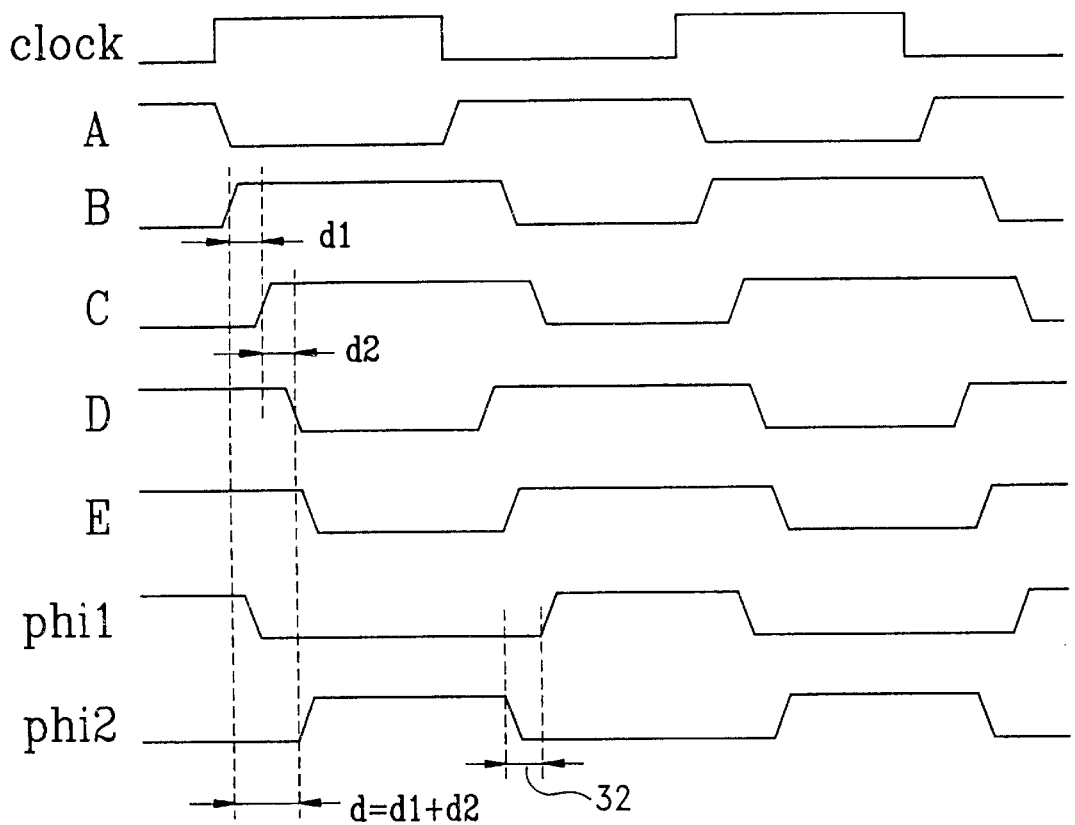
FIG. 3C shows timing diagrams of some pertinent signals of FIG. 3A.
Figure 4A:
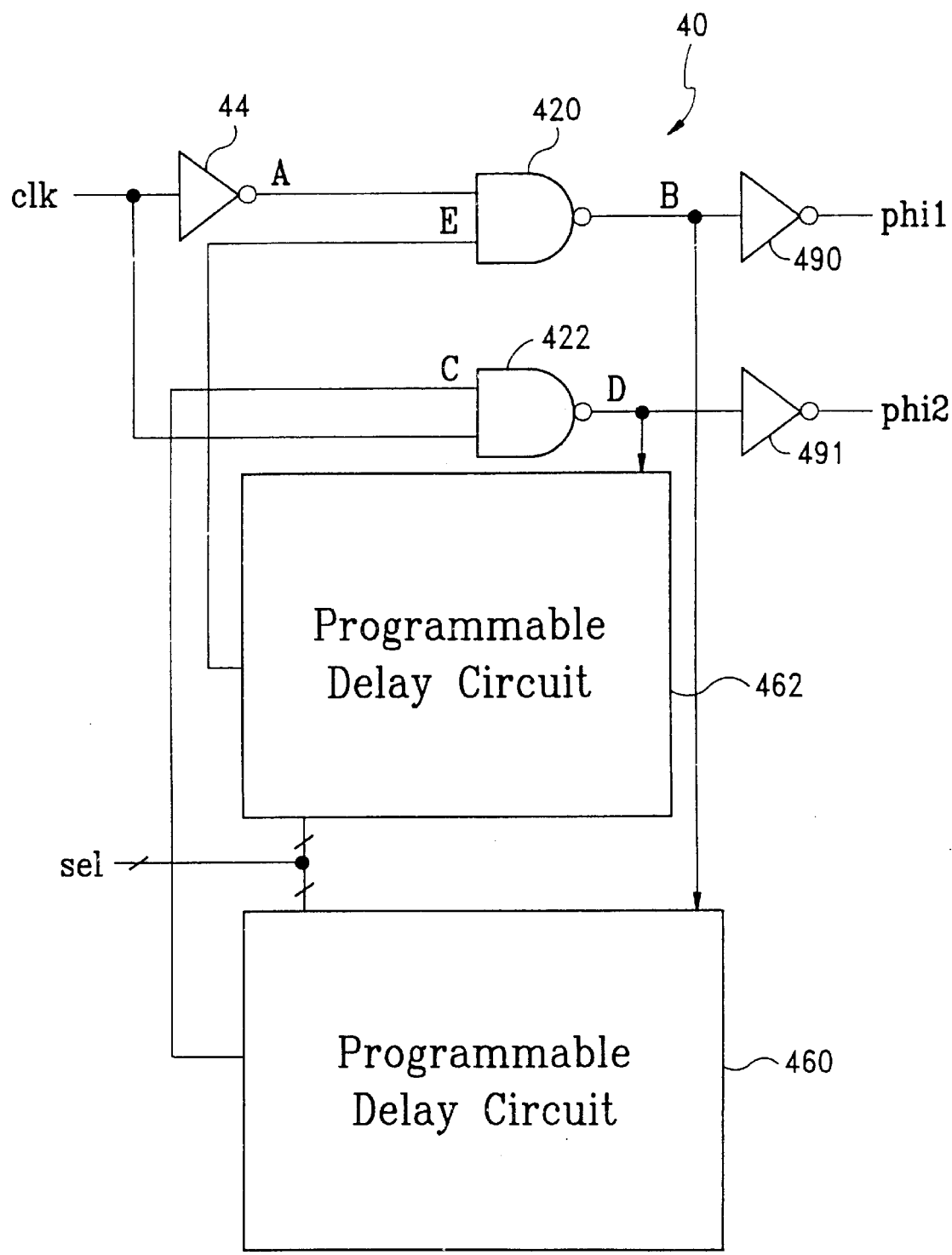
FIG. 4A shows a schematic diagram of a programmable non-overlap clock generator.
Figure 4B:
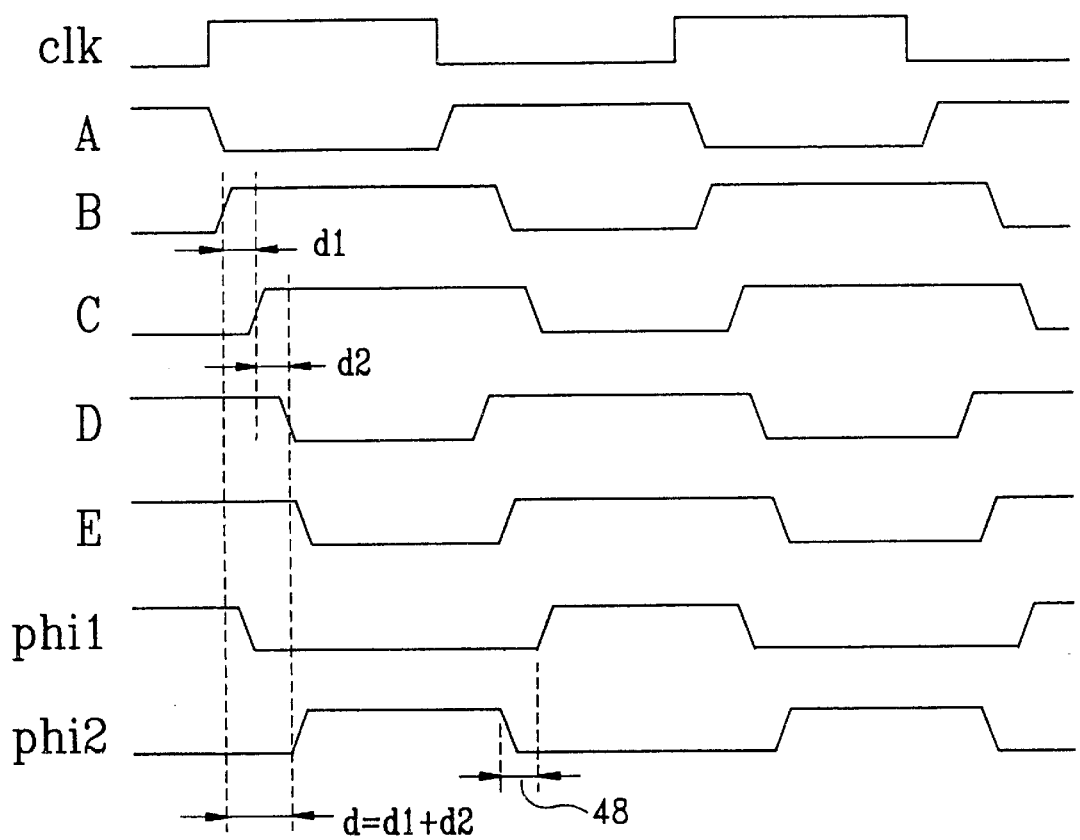
FIG. 4B shows timing diagrams of some pertinent signals of FIG. 4A.
Figure 5A:
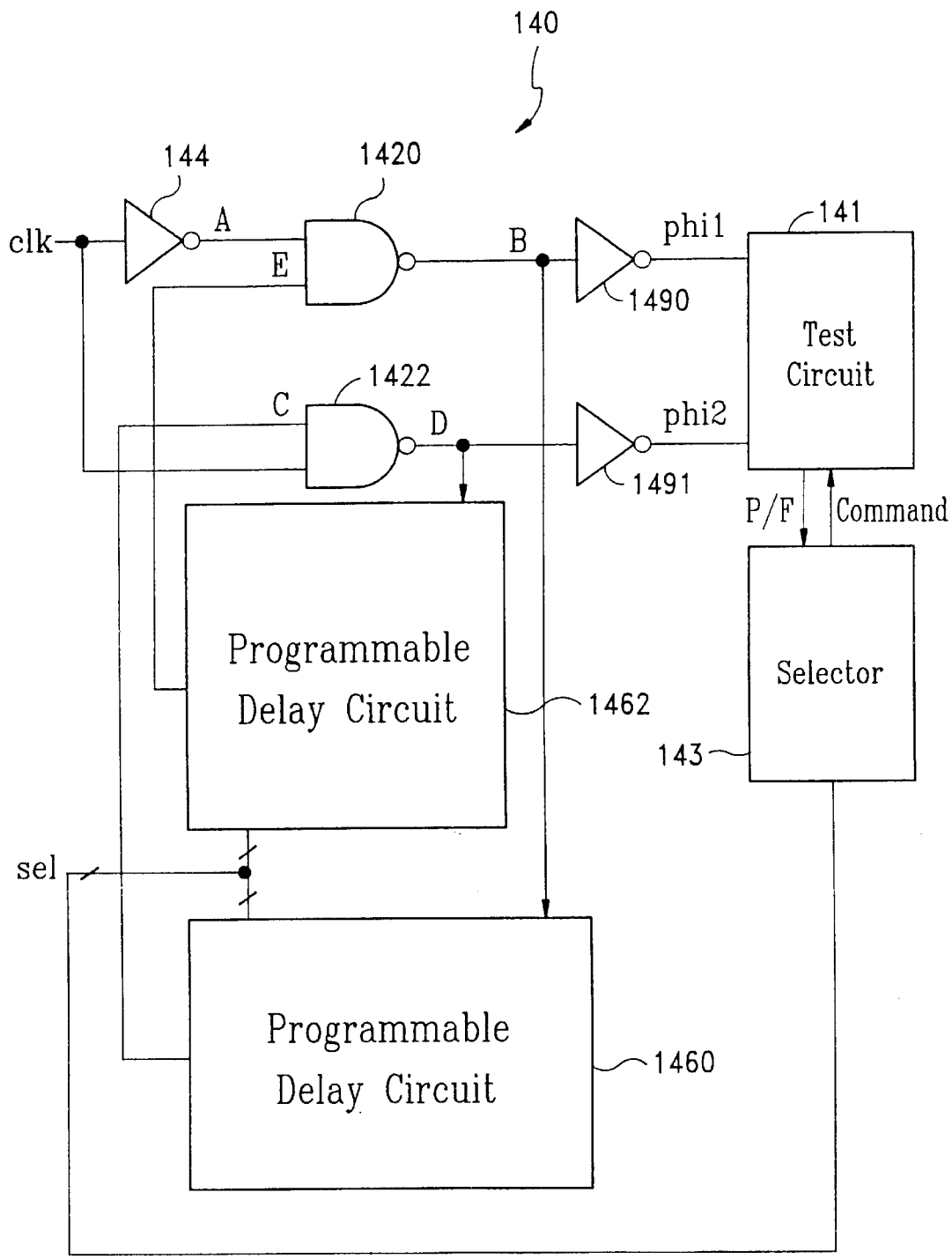
FIG. 5A shows a schematic diagram of a self-setup non-overlap clock generator according to the present invention.

FIG. 5A shows a schematic diagram of a self-setup non-overlap clock generator 140 according to the present invention. This clock generator 140 includes two standard NAND gates, i.e., the first NAND gate 1420 and the second NAND gate 1422. A primary clock signal clk is input to a first input terminal of the second NAND gate 1422, and an inverted primary clock signal generated by an inverter 144 at node A is input to a first input terminal of the first NAND gate 1420. The output terminal of the first NAND gate 420 is cross-coupled to a second input terminal of the second NAND gate 1422 via a delay path determined by a first programmable delay circuit 1460. Similarly, the output terminal of the second NAND gate 1422 is cross-coupled to a second input terminal of the first NAND gate 1420 via a delay path determined by a second programmable delay circuit 1462. The first programmable delay circuit 1460 and the second programmable delay circuit 1462 are used to delay the output signal of the first NAND gate 1420 and the output signal of the second NAND gate 1422, respectively, a predetermined amount of time according to at least a selection signal sel. The predetermined amount of time is thus programmable (or adjustable) according to a different value of the selection signal (or signals). Buffers 1490 and 1491 are optionally and preferably connected to the output of the NAND gates 1420 and 1422 respectively to increase their driving capability.

Figure 5B:
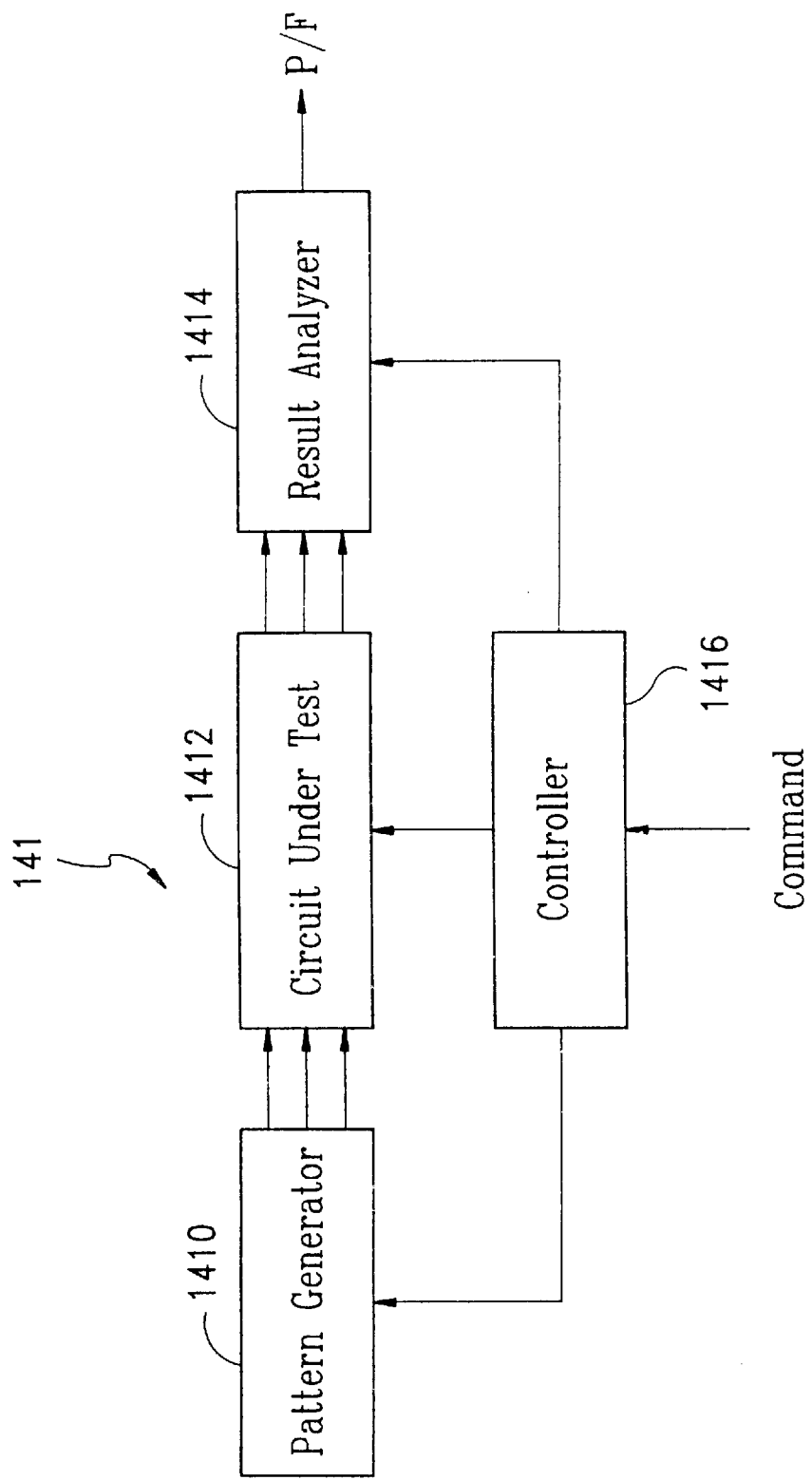
FIG. 5B shows a block diagram illustrating a general BIST circuit.

The outputs of the NAND gates 1420 and 1422 are fed to a test circuit 141, which is used to test whether the generated non-overlap clocks phi1 and phi2 conform to a predetermined non-overlap spacer. In this embodiment, the test circuit 141 is a built-in self-test (BIST) circuit, which is implemented by a conventional method, such as the Logic Vision Built-In Self-Test (BIST) developed by Logic Vision, Inc. FIG. 5B shows a block diagram illustrating a general BIST circuit 141, which includes a pattern generator 1410, a circuit under test 1412, a result analyzer 1414, and a controller 1416. Upon receiving a command by the controller 1416, the pattern generator 1410 generates and inputs some patterns to the circuit under test 1412. The resultant outputs from the circuit under test 1412 are analyzed by the result analyzer 1414, thereby generating an output Pass/Fail (or P/F) of the BIST circuit 141 indicating the success/failure status of the circuit under test 1412. Specifically, if the circuit under test 1412 meets the predetermined requirement, the output P is generated, or otherwise the output F is generated.

Referring back to FIG. 5A, a selector 143 is provided to generate a suitable selection signal sel in response to the output P/F of the BIST circuit 141. Consequently, an optimal non-overlap spacer selected by the second programmable delay circuit 1462 and the first programmable delay circuit 1460 is made, so that the smallest value of the available non-overlap spaces conforming to the predetermined requirement is automatically self-setup.

Figure 5C:
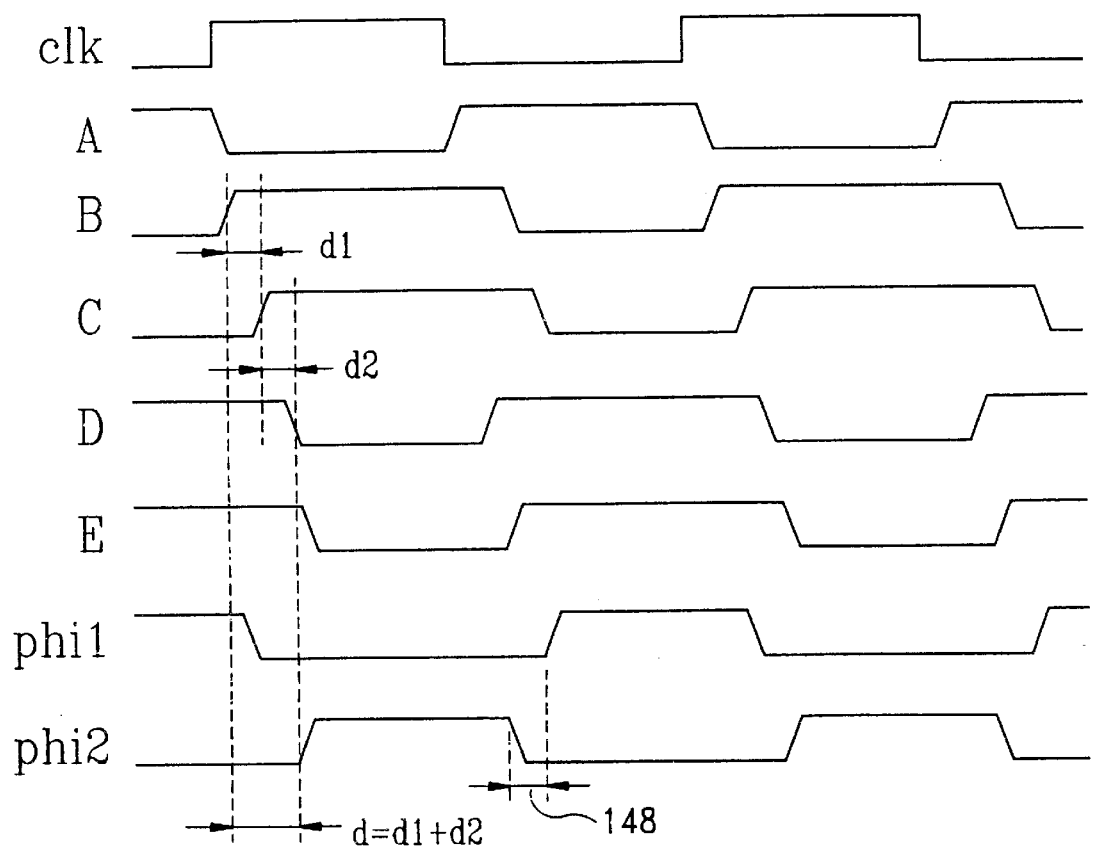
FIG. 5C shows timing diagrams of some pertinent signals of FIG. 5A.

It is appreciated that the first programmable delay circuit 1460 and the second programmable delay circuit 1462 can alternatively be controlled individually by two selection signals with different value. Timing diagrams representing some pertinent signals of FIG. 5A are shown in FIG. 5C. The non-overlap space d in the self-setup non-overlap clock generator 140 is determined by both the delay time d1 of the first programmable delay circuit 1460, and the delay time d2 of the NAND gate 1422. Similarly, another non-overlap space 148 is determined by the delay time of the selected delay component in the second programmable delay circuit 1462 and the delay time of the NAND gate 1420.

As the delay time of the NAND gate is generally fixed by the intrinsic delay and the loading thereof, therefore suitable non-overlap space d is setup by the first programmable delay circuit 1460. The non-overlap space therefore can be self-setup even after the chip is fabricated, and therefore an optimized clock speed can be achieved, thereby enhancing the performance of the shift register circuits.

Figure 6A:
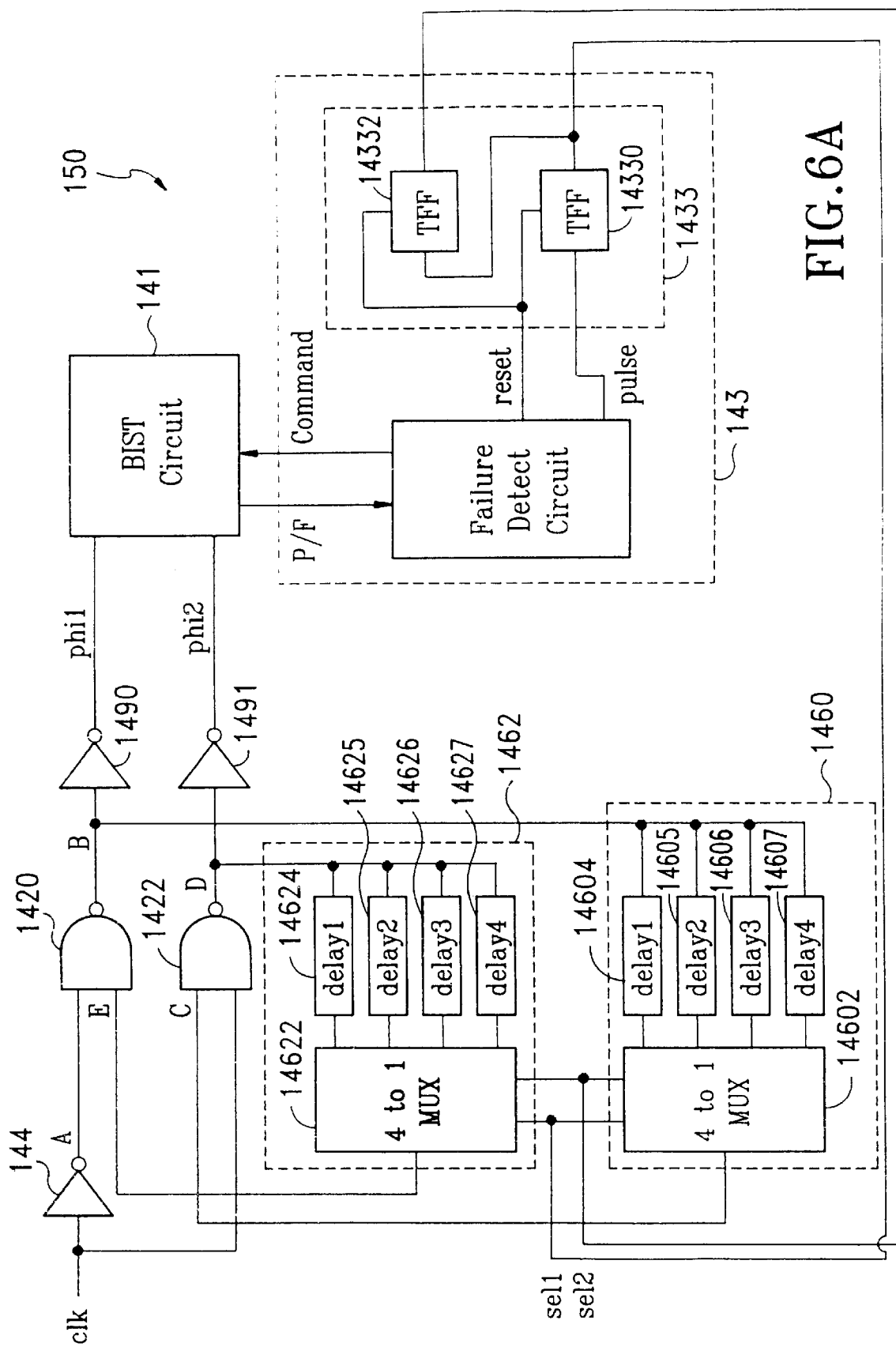
FIG. 6A shows a schematic diagram of a self-setup non-overlap clock generator according to one embodiment of the present invention.

FIG. 6A shows a schematic diagram of a self-setup non-overlap clock generator 150 according to one embodiment of the present invention. This clock generator 150 includes two standard NAND gates, i.e., the first NAND gate 1420 and the second NAND gate 1422. A primary clock signal clk is input to a first input terminal of the second NAND gate 1422, and an inverted primary clock signal generated by an inverter 144 at node A is input to a first input terminal of the first NAND gate 1420. The output terminal of the first NAND gate 1420 is cross-coupled to a second input terminal of the second NAND gate 1422 via a delay path determined by a first delay circuit 1460. Similarly, the output terminal of the second NAND gate 1422 is cross-coupled to a second input terminal of the first NAND gate 1420 via a delay path determined by a second delay circuit 1462. In this embodiment, the first programmable delay circuit 1460 includes four parallel-configured delay components designated as delay1 14604, delay2 14605, delay3 14606, and delay4 14607. The second programmable delay circuit 1462 also includes four parallel-configured delay components designated as delay1 14624, delay2 14625, delay3 14626, and delay4 14627. Further, all of the delay components in the first programmable delay circuit 1460 or the second delay circuit 1462 are respectively connected to a combinational logic device 14602 or 14622, which has many input terminals and usually has just one output. In this embodiment, a standard 4-to-1 multiplexer (MUX) is used as the aforementioned combinational logic device 14602 or 14622. For each multiplexer 14602 or 14622, one of its input is selectively connected at a time to the output terminal of the multiplexer, wherein the selection is controlled by a pair of selection signals sel1 and sel2 to the multiplexer 14602 and 14622.

Figure 6B:
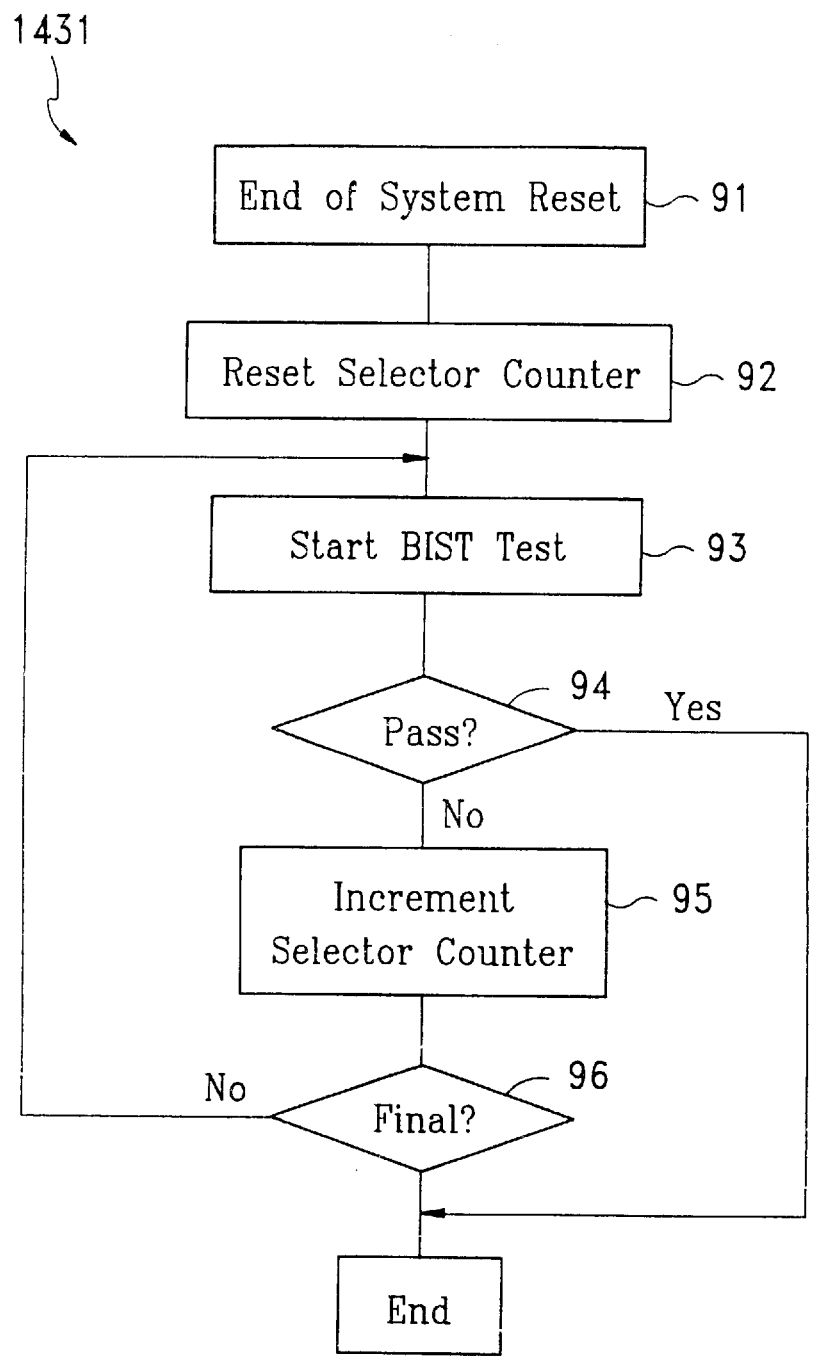
FIG. 6B illustrates a flow diagram of the failure detect circuit.
Figure 7A:
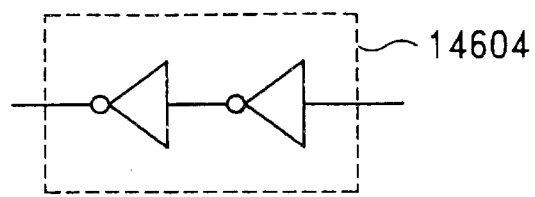
FIGS. 7A to 7D shows coupled inverters that construct the delay components according to the embodiment of FIG. 6A.
Figure 7B:
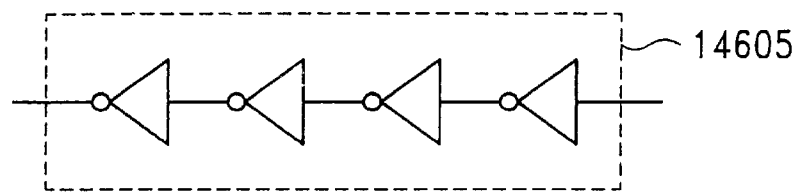
Figure 7C:
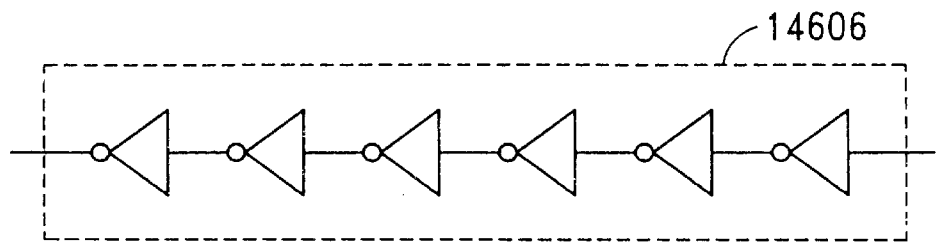
Figure 7D:
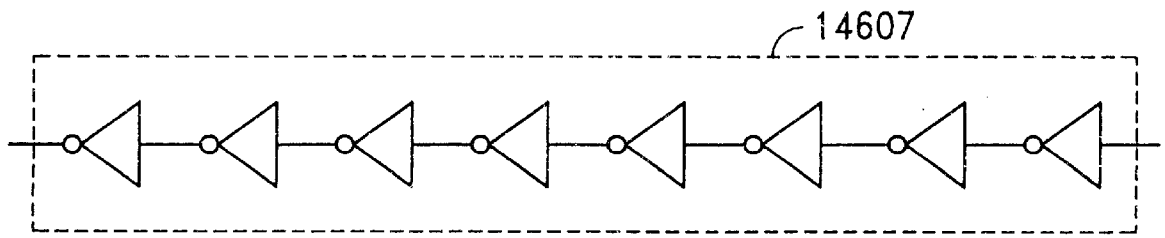

More particularly, the selector 143 in this embodiment includes a failure detect circuit 1431 and a selector counter 1433, wherein a flow diagram of the failure detect circuit 1431 is further illustrated in FIG. 6B, and the selector counter 1433 includes two flip-flops (14330 and 14332) in serial. At the end of a system reset (step 91), the failure detect circuit 1431 resets the content of the selector counter 1433 to 00 by sending a reset signal to the reset input terminal of the flip-flops 14330 and 14332 (step 92). Next, in step 93, the failure detect circuit 1431 sends a command signal to the BIST circuit 141 to start the BIST test. If the test passes to meet the predetermined requirement concerning the non-overlap space (step 94), no further test is performed, thereby choosing a delay component with minimum value among the delay components 14624–14627, and 14604–14607. On the other hand, when the test fails, the content of the selector counter 1433 is incremented to 01 (step 95) by sending a pulse to the input terminal of the first flip-flop 14330. Subsequently, steps 93 to 95 are repeated until the test passes or all possible selections fail.

As the delay times of the NAND gate and the multiplexer are generally fixed by the intrinsic delay and the loading thereof, therefore suitable non-overlap space d is generally attained by an appropriate delay component in the first programmable delay circuit 1460. The non-overlap space therefore can be self-setup even after the chip is fabricated, and therefore an optimized clock speed can be achieved, thereby enhancing the performance of the shift register circuits. In this embodiment, these delay components are constructed by connecting even number of inverter as shown in FIGS. 7A to 7D. A required delay time is thus attainable by adjusting the size or/and the number of the inverter.

Figure 8:
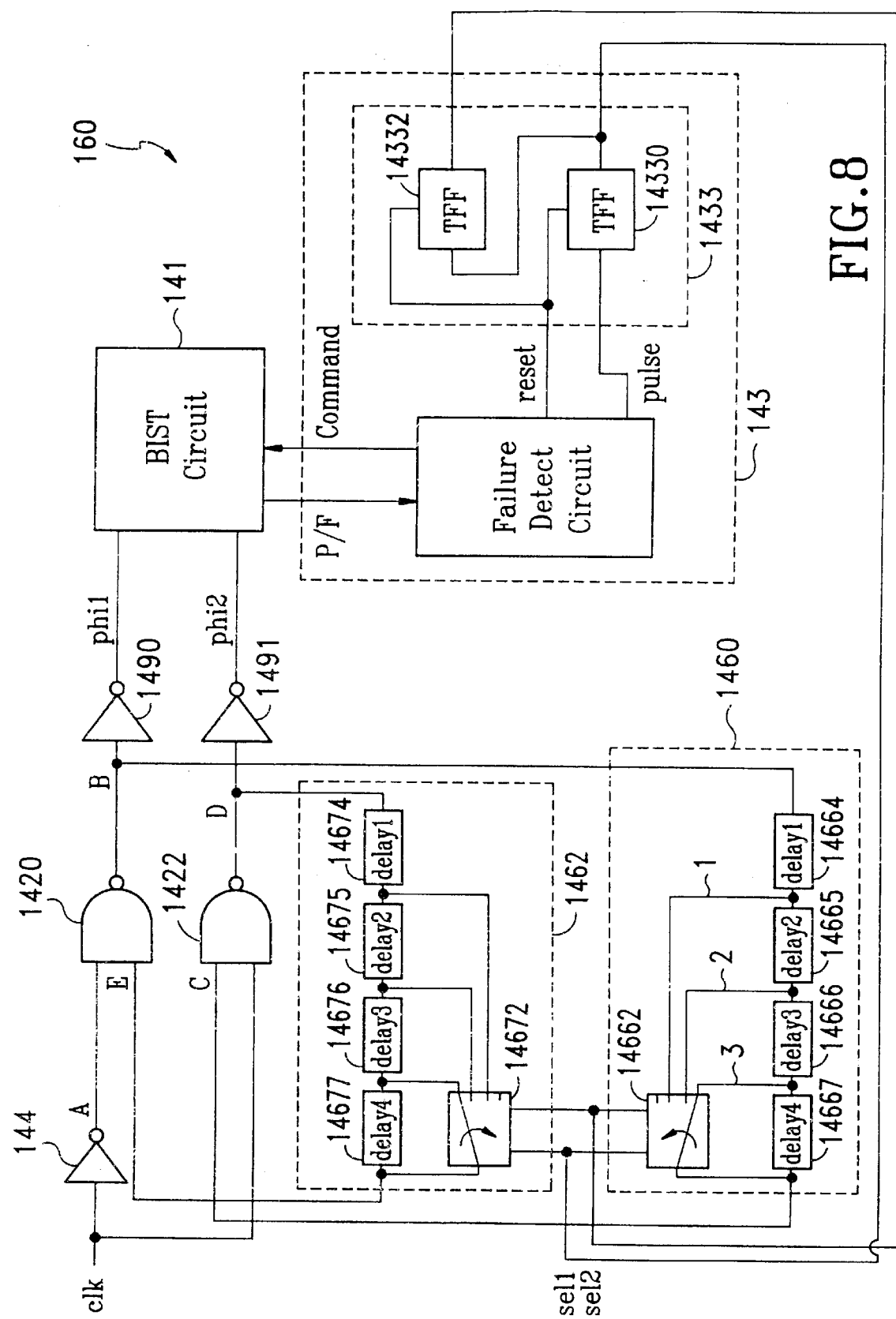
FIG. 8 shows a schematic diagram of a self-setup non-overlap clock generator according to another embodiment of the present invention.

FIG. 8 shows a schematic diagram of a self-setup non-overlap clock generator 160 according to another embodiment of the present invention. This clock generator 160 includes two standard NAND gates, i.e., the first NAND gate 1420 and the second NAND gate 1422. A primary clock signal clk is input to a first input terminal of the second NAND gate 1422, and an inverted primary clock signal generated by an inverter 144 at node A is input to a first input terminal of the first NAND gate 1420. The output terminal of the first NAND gate 1420 is cross-coupled to a second input terminal of the second NAND gate 1422 via a delay path determined by a first delay circuit 1460. Similarly, the output terminal of the second NAND gate 1422 is cross-coupled to a second input terminal of the first NAND gate 1420 via a delay path determined by a second delay circuit 1462. In this embodiment, the first programmable delay circuit 1460 includes four serial-connected delay components designated as delay1 14674, delay2 14675, delay3 14676, and delay4 14677. The second programmable delay circuit 1462 also includes four serial-connected delay components designated as delay1 14664, delay2 14665, delay3 14666, and delay4 14667. Further, the delay path of the delay components in the first programmable delay circuit 1460 or the second delay circuit 1462 is controlled by a switch 14662 or 14672, respectively. For example, if the first connector 1 is chosen, the delay path is determined by the delay1 14664. If neither of the connectors 1, 2, and 3 is chosen, the delay path is determined by all of the delay1 14664, the delay2 14665, the delay3 14666, and the delay4 14667.

More particularly, as being discussed for the previous embodiment, the selector 143 in this embodiment includes a failure detect circuit 1431 and a selector counter 1433, wherein a flow diagram of the failure detect circuit 1431 is further illustrated in FIG. 6B, and the selector counter 1433 includes two flip-flops (14330 and 14332) in serial. At the end of a system reset (step 91), the failure detect circuit 1431 resets the content of the selector counter 1433 to 00 by sending a reset signal to the reset input terminal of the flip-flops 14330 and 14332 (step 92). Next, in step 93, the failure detect circuit 1431 sends a command signal to the BIST circuit 141 to start the BIST test. If the test passes to meet the predetermined requirement concerning the non-overlap space (step 94), no further test is performed, thereby choosing a delay component with minimum value among the delay components 14624–14627, and 14604–14607. On the other hand, when the test fails, the content of the selector counter 1433 is incremented to 01 (step 95) by sending a pulse to the input terminal of the first flip-flop 14330. Subsequently, steps 93 to 95 are repeated until the test passes or all possible selections fail.

It is appreciated that some portion of the programmable non-overlap clock generator may be modified without departing from the claimed scope of the invention. For example, the NAND gates 1420 and 1422 can be replaced by standard NOR gates. Further, the multiplexer 14622 and 14620 can be individually and differently controlled by different set of selection signals. Although specific embodiments have been illustrated and described, it will be obvious to those skilled in the art that various modifications may be made without departing from the spirit which is intended to be limited solely by the appended claims.

What is claimed is:

1. A self-setup non-overlap clock generator, comprising:
   a primary clock signal input terminal for providing a primary clock signal;
   a selection signal input terminal for providing at least one selection signal;
   a first logic gate having a first input terminal and a second input terminal, the first input terminal of said first logic gate being coupled to receive an inverted signal of said primary clock signal;
   a second logic gate having a first input terminal and a second input terminal, the first input terminal of said second logic gate being coupled to receive said primary clock signal;
   first programmable delay means, connected between an output of said first logic gate and the second input terminal of said second logic gate, for delaying an output signal from said first logic gate an amount of time according to said at least one selection signal, said amount of time being adjustable according to a different value of said at least one selection signal;
   second programmable delay means, connected between an output of said second logic gate and the second input terminal of said first logic gate, for delaying an output signal from said second logic gate a predetermined amount of time according to said at least one selection signal, said predetermined amount of time being adjustable according to a different value of said at least one selection signal, thereby generating a first clock signal from the output of said first logic gate, and generating a second clock signal from the output of said second logic gate, wherein the first clock signal and the second clock signal are not logically active at the same time;
   means for testing whether a non-overlap space between the first clock signal and the second clock signal conforms to a predetermined value; and
   selection means for generating said at least one selection signal in response to at least one output of said testing means such that a smallest value out of all possible non-overlap spaces is chosen.

2. The clock generator according to claim 1, further comprising a first buffer coupled to the output of said first logic gate.

3. The clock generator according to claim 2, further comprising a second buffer coupled to the output of said second logic gate.

4. The clock generator according to claim 1, wherein said first logic gate comprises a first NAND gate.

5. The clock generator according to claim 4, wherein said second logic gate comprises a second NAND gate.

6. The clock generator according to claim 1, wherein said first programmable delay means comprises a plurality of first delay components, one of said first delay components being then selected as the output of said first programmable delay circuit.

7. The clock generator according to claim 6, wherein said second programmable delay means comprises a plurality of second delay components, one of said second delay components being then selected as the output of said second programmable delay means.

8. The clock generator according to claim 7, wherein said first delay component is selected by a first multiplexer.

9. The clock generator according to claim 8, wherein said second delay component is selected by a second multiplexer.

10. The clock generator according to claim 7, wherein each of said first and second delay components comprises an even number of inverters.

11. The clock generator according to claim 1, wherein said first programmable delay means comprises a plurality of first delay components connected in serial, at least one of said first delay components being selected as a delay path of said first programmable delay means.

12. The clock generator according to claim 11, wherein said second programmable delay means comprises a plurality of second delay components connected in serial, at least one of said second delay components being selected as a delay path of said second programmable delay means.

13. The clock generator according to claim 1, wherein said selection means comprises:
   a selector counter which provides said at least one selection signal; and a failure detect circuit which commands said testing means to start the test, and controls said selector counter in response to said at least one output of said testing means, so that said smallest value is chosen.

14. The clock generator according to claim 13, wherein said selector counter comprises a plurality of flip-flops connected in serial, outputs of said plurality of flip-flops providing said at least one selection signal.

15. The clock generator according to claim 13, wherein function of said failure detect circuit is performed by the steps of:

resetting content of said selector counter;

sending a command signal to said testing means to start the test; and incrementing the content of said selector counter when the test by said testing means fails to conform to the predetermined value.

16. A self-setup non-overlap clock generator, comprising:

a primary clock signal input terminal for providing a primary clock signal;

a selection signal input terminal for providing at least one selection signal;

a first logic gate having a first input terminal and a second input terminal, the first input terminal of said first logic gate being coupled to receive an inverted signal of said primary clock signal;

a second logic gate having a first input terminal and a second input terminal, the first input terminal of said second logic gate being coupled to receive said primary clock signal;

a plurality of first delay components coupled to receive an output of said first logic gate;

a first multiplexer coupled to said plurality of first delay components, one of said first delay components being then selected by said first multiplexer as an output of said first multiplexer coupled to the second input terminal of said second logic gate;

a plurality of second delay components coupled to receive an output of said second logic gate;

a second multiplexer coupled to said plurality of second delay components, one of said second delay components being then selected by said second multiplexer as an output of said second multiplexer coupled to the second input terminal of said first logic gate, thereby generating a first clock signal from the output of said first logic gate, and generating a second clock signal from the output of said second logic gate, wherein the first clock signal and the second clock signal are not logically active at the same time;

a self-test circuit configured to test whether a non-overlap space between the first clock signal and the second clock signal conforms to a predetermined value;

a selector counter which provides said at least one selection signal; and a failure detect circuit which commands said self-test circuit to start the test, and controls said selector counter in response to said at least one output of said self-test circuit, so that a smallest value out of all possible non-overlap spaces is chosen.

17. The clock generator according to claim 16, further comprising a first buffer coupled to the output of said first logic gate.

18. The clock generator according to claim 17, further comprising a second buffer coupled to the output of said second logic gate.

19. The clock generator according to claim 16, wherein said first logic gate comprises a first NAND gate.

20. The clock generator according to claim 19, wherein said second logic gate comprises a second NAND gate.

21. The clock generator according to claim 16, wherein each of said first and second delay components comprises an even number of inverters.

22. The clock generator according to claim 16, wherein said selector counter comprises a plurality of flip-flops connected in serial, outputs of said plurality of flip-flops providing said at least one selection signal.

23. The clock generator according to claim 16, wherein function of said failure detect circuit is performed by the steps of:

resetting content of said selector counter;

sending a command signal to said self-test circuit to start the test; and incrementing the content of said selector counter when the test by said self-test circuit fails to conform to the predetermined value.

* * * * *